US012336329B2

(12) United States Patent
Tsai et al.

(10) Patent No.: US 12,336,329 B2
(45) Date of Patent: *Jun. 17, 2025

(54) INFRARED LIGHT-EMITTING DIODE

(71) Applicant: TIANJIN SANAN OPTOELECTRONICS CO., LTD., Tianjin (CN)

(72) Inventors: Chunfu Tsai, Tianjin (CN); Chihhung Hsiao, Tianjin (CN)

(73) Assignee: TIANJIN SANAN OPTOELECTRONICS CO., LTD., Tianjin (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/653,040

(22) Filed: May 2, 2024

(65) Prior Publication Data

US 2024/0282887 A1     Aug. 22, 2024

Related U.S. Application Data

(63) Continuation of application No. 17/354,022, filed on Jun. 22, 2021, now Pat. No. 12,009,453, which is a
(Continued)

(51) Int. Cl.
*H10H 20/812* (2025.01)
*H10H 20/82* (2025.01)
(Continued)

(52) U.S. Cl.
CPC ......... *H10H 20/812* (2025.01); *H10H 20/82* (2025.01); *H10H 20/824* (2025.01); *H10H 20/831* (2025.01); *H10H 20/8506* (2025.01)

(58) Field of Classification Search
CPC ......... H01L 33/06; H01L 33/22; H01L 33/30; H01L 33/38; H01L 33/486; H01L 33/04;
(Continued)

(56) References Cited

U.S. PATENT DOCUMENTS 12,009,453 B2 * 6/2024 Tsai .................. H01L 33/486
2010/0244077 A1 * 9/2010 Yao .................. H01L 33/0093
                                                       257/E31.127
2021/0313486 A1   10/2021 Tsai

FOREIGN PATENT DOCUMENTS

CN      102468387 A    5/2012
JP      2001244575 A   9/2001
(Continued)

OTHER PUBLICATIONS

Search Report issued to PCT application No. PCT/CN2019/121018 by the WIPO on Aug. 26, 2020.
(Continued)

*Primary Examiner* — Earl N Taylor
(74) *Attorney, Agent, or Firm* — Thomas Horstemeyer, LLP

(57) ABSTRACT

An infrared light-emitting diode (LED) includes a semiconductor light-emitting unit which includes an active layer, a first waveguide layer, a second waveguide layer, a first cladding layer and a second cladding layer. The active layer includes at least one pair of layers. Each pair of layers includes a well layer and a barrier layer. The first and the second waveguide layers are respectively disposed on two opposite sides of the active layer, and are independently made of a semiconductor compound represented by $(Al_{X3}Ga_{1-X3})_{Y1}In_{1-Y1}P$, wherein $0 \leq X3 \leq 1$ and $0 < Y1 \leq 1$. The first cladding layer is disposed on the first waveguide layer opposite to the active layer. The second cladding layer is disposed on the second waveguide layer opposite to the active layer.

20 Claims, 4 Drawing Sheets

Related U.S. Application Data continuation-in-part of application No. PCT/CN2019/121018, filed on Nov. 26, 2019.

(51) Int. Cl.
*H10H 20/824* (2025.01)
*H10H 20/831* (2025.01)
*H10H 20/85* (2025.01)

(58) Field of Classification Search
CPC ....... H01L 33/14; H01L 33/36; H10H 20/812; H10H 20/82; H10H 20/824; H10H 20/831; H10H 20/8506; H10H 20/811; H10H 20/816; H10H 20/83
See application file for complete search history.

(56) References Cited

FOREIGN PATENT DOCUMENTS

| | | | |
|---|---|---|---|
| JP | 2011077496 | A | 4/2011 |
| JP | 2015167245 | A | 9/2015 |
| JP | 2016076685 | A | 5/2016 |
| JP | 2019160845 | A | 9/2019 |
| WO | 2014095353 | A1 | 6/2014 |

OTHER PUBLICATIONS

Search Report appended to an Office Action, which was issued to Chinese counterpart application No. 201980005977.3 by the CNIPA on Jun. 29, 2023, with an English translation thereof.

\* cited by examiner

INFRARED LIGHT-EMITTING DIODE

CROSS-REFERENCE TO RELATED APPLICATION

This is a continuation application of U.S. patent application Ser. No. 17/354,022, filed on Jun. 22, 2021, which is a bypass continuation-in-part (CIP) application of PCT International Application No. PCT/CN2019/121018, filed on Nov. 26, 2019. The aforesaid applications are incorporated by reference herein in their entirety.

FIELD

The disclosure relates to a semiconductor optoelectronic device, and more particularly to an infrared light-emitting diode.

BACKGROUND

An infrared light-emitting diode (LED) is a diode which is configured to emit infrared light, and is applied in several fields such as security controls, communication systems, remote control devices, sensors, night lightings, etc., and especially in the field of gas detection. In terms of LED packaging, flip-chip packaging is an important technique used to enhance light-emitting efficiency, heat dissipation, and packaging reliability of an LED device produced thereby.

Yet, there are several limitations in production of infrared LED using flip-chip packaging. A conventional ternary epitaxial structure of an infrared LED usually includes a p-type semiconductor layer made of an AlGaAs-based material. To apply flip-chip packaging, the p-type semiconductor layer is required to be bonded to a substrate through a bonding layer made of $SiO_2$. However, the bonding of the p-type semiconductor layer to the bonding layer is found to be poor and unsatisfactory. When the substrate is removed, the epitaxial structure easily peels off from the bonding layer and fails to bond with the bonding layer. In addition, the ternary structure of the infrared LED is usually subjected to wet etching so as to form a mesa, whereas flip-chip packaging for a red light LED adopts dry etching. Thus, such conventional ternary epitaxial structure used in the infrared LED is not suitable to be subjected to flip-chip packaging.

SUMMARY

Therefore, an object of the disclosure is to provide an infrared light-emitting diode (LED) and an LED packaged module that can alleviate at least one of the drawbacks of the prior art.

According to the disclosure, the infrared LED includes a semiconductor light-emitting unit which includes an active layer, a first waveguide layer, a second waveguide layer, a first cladding layer and a second cladding layer. The active layer has a quantum well structure which includes at least one pair of layers, each pair of layers including a well layer and a barrier layer. The first waveguide layer and the second waveguide layer are respectively disposed on two opposite sides of the active layer, and are independently made of a semiconductor compound represented by $((Al_{X3}Ga_{1-X3})_{Y1}In_{1-Y1}P$, wherein $0 \leq X3 \leq 1$ and $0 < Y1 \leq 1$. The first cladding layer is disposed on the first waveguide layer opposite to the active layer. The second cladding layer is disposed on the second waveguide layer opposite to the active layer.

According to the disclosure, the LED packaged module includes a mounting board, and at least one abovementioned infrared LED which is mounted on the mounting board.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
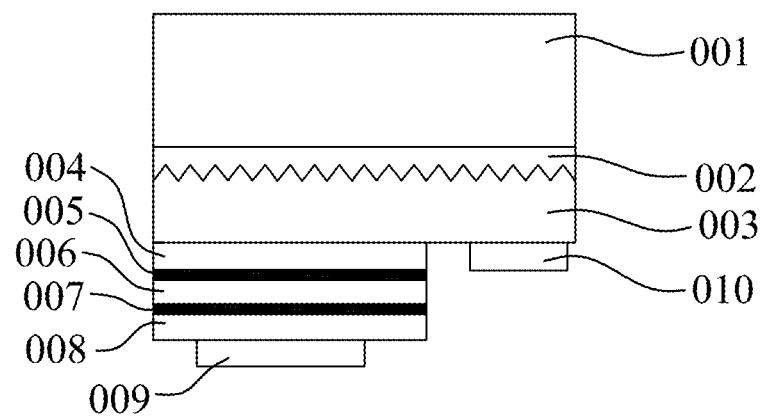
FIG. 1 is a sectional view illustrating an embodiment of an infrared light-emitting diode (LED) according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of an infrared light-emitting diode (LED) according to the disclosure includes a semiconductor light-emitting unit, which includes an active layer 006, a first waveguide layer 005, a second waveguide layer 007, a first cladding layer 004 and a second cladding layer 008.

Figure 2:
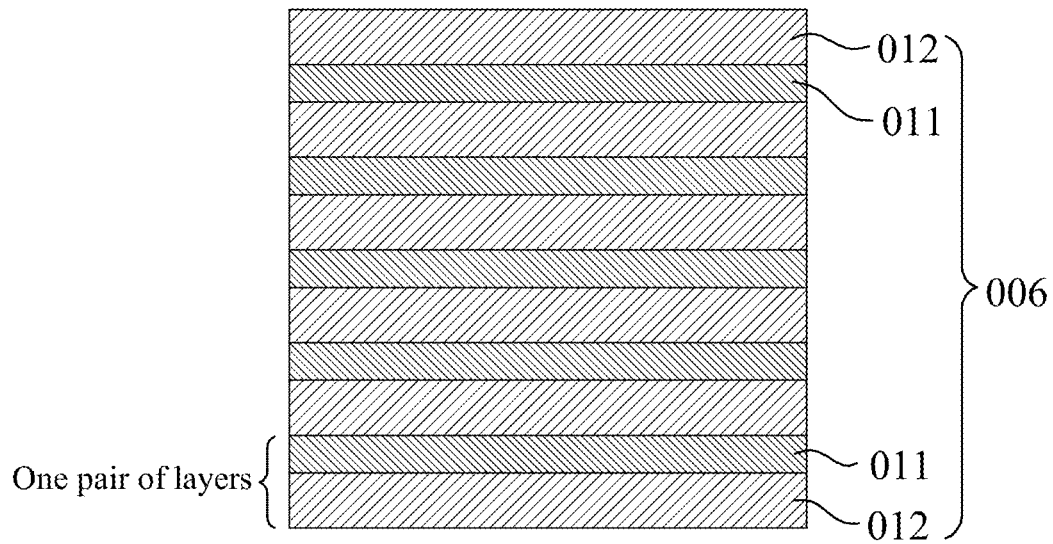
FIG. 2 is a schematic view illustrating an active layer of the embodiment of the infrared LED according to the disclosure.

Referring to FIG. 2, the active layer 006 has a quantum well structure which includes at least one pair of layers. Each pair of layers includes a well layer 011 and a barrier layer 012. In certain embodiments, the quantum well structure of the active layer 006 includes not greater than 10 pairs of the layers, and the well layers 011 and the barrier layers 012 in the quantum well structure are alternately stacked. When the quantum well structure includes too many pairs of the layers (e.g., greater than 10 pairs), a lattice mismatch generated between the well layers 011 and the barrier layers 012 may cause crystal defects and thus reduce light-emitting efficiency of the LED. In addition, when the wells 011 are fewer (e.g., not greater than 10), a region for radiative recombination of electrons and holes becomes narrower, resulting in a higher probability of radiative recombination of electrons and holes in the active layer 006, thereby achieving a higher light-emitting efficiency.

In this embodiment, the quantum well structure of the active layer 006 includes five pairs of layers (i.e., five barrier layers 012 and five well layers 011 alternately stacked on one another, and one of the five barrier layers 012 serving as a bottommost layer of the quantum well structure), and an additional barrier layer 012 serving as a topmost layer of the quantum well structure.

For each of the pairs of layers, the well layer 011 is made of a semiconductor compound represented by $(In_{X1}Ga_{1-X1})As$, wherein $0 \leq X1 \leq 1$. In certain embodiments, $0.1 \leq X1 \leq 0.3$. By controlling the In content (i.e., X1 value) within the predetermined range, the light-emitting unit is configured to emit a light having a wavelength which ranges from 680 nm to 1100 nm. Each of the well layers 011 may have a thickness ranging from 3 nm to 30 nm, such as ranging from 4 nm to 15 nm. Providing that the thickness of the well layer 011 is fixed, when the well layer 011 has a higher content of In (i.e., larger X1), the light-emitting unit may emit a light having a longer wavelength.

For each of the pairs of layers, the barrier layer 012 is made of a semiconductor compound represented by $(Al_{X2}Ga_{1-X2})As$, and $0 \leq X2 \leq 1$. In certain embodiments, $0.05 \leq X2 \leq 0.5$, so that the barrier layer 012 may have an improved crystallinity. In order to prevent light being absorbed by the barrier layer 012, the barrier layer 012 may have a band gap larger than that of the well layer 011. Each of the barrier layers 012 may have a thickness identical to, or greater than that of each of the well layers 011. As long as the barrier layer 012 is sufficient to induce a tunnel effect, the barrier layer 012 may be made as thick as possible to confine more current carriers, so as to increase a probability of radiative recombination of electrons and holes, thereby achieving an improved light-emitting efficiency.

The active layer 006 may have a total thickness ranging from 0.02 μm to 2 μm. There is no restriction regarding conductivity of the active layer 006. That is, the active layer 006 may be nondoped or doped (e.g., p-type doped or n-type doped). To improve the light-emitting efficiency, the active layer 006 may have a current carrier concentration lower than $3 \times 10^{17}$ cm−3. In addition, the active layer 006 may have a high crystallinity, so as to reduce epitaxial growth defects, and reduce light absorption by these epitaxial defects, which may be conducive to an enhanced light-emitting efficiency.

The first waveguide layer 005 and the second waveguide layer 007 are respectively disposed on two opposite sides of the active layer 006, and are independently made of a semiconductor compound represented by $(Al_{X3}Ga_{1-X3})_{Y1}In_{1-Y1}P$, wherein $0 \leq X3 \leq 1$ and $0 < Y1 \leq 1$. In certain embodiments, each of the first and the second waveguide layers 005, 007 may have a band gap identical to or greater than that of the barrier layer 012. In such case, in $(Al_{X3}Ga_{1-X3})_{Y1}In_{1-Y1}P$, $0.2 \leq X3 \leq 0.8$ and $0.3 \leq Y1 \leq 0.7$.

The first waveguide layer 005 and the second waveguide layer 007 may have a thickness larger than 10 nm, such as from 20 nm to 100 nm. There is no restriction regarding conductivity of the first waveguide layer 005 and that of the second waveguide layer 007. For example, each of the first waveguide layer 005 and the second waveguide layer 007 may be doped with p-type or n-type dopants, or may be undoped. In certain embodiments, each of the first and the second waveguide layers 005, 007 is made of an undoped material with high crystallinity and/or has a current carrier concentration lower than $3 \times 10^{17}$ cm$^{-3}$ so as to enhance light-emitting efficiency of the LED.

Each of the first waveguide layer 005 and the second waveguide layer 007 may have a region to which the active layer 006 is bonded, and which ranges from 20000 μm2 to 90000 μm2.

The first cladding layer 004 is disposed on the first waveguide layer 005 opposite to the active layer 006. The second cladding layer 008 is disposed on the second waveguide layer 007 opposite to the active layer 006. The first and the second waveguide layers 005, 007 are respectively configured to reduce a lattice mismatch generated between the active layer 006 and the first cladding layer 004 and between the active layer 006 and the second cladding layer 008.

The first cladding layer 004 and the second cladding layer 008 are independently made of a semiconductor compound represented by $(Al_{X4}Ga_{1-X4})_{Y2}In_{1-Y2}P$, wherein $0 \leq X4 \leq 1$ and $0 < Y2 \leq 1$. Each of the first and the second cladding layers 004, 008 may have a band gap greater than that of the barrier layer 012. In addition, each of the first and the second cladding layers 004, 008 may have a band gap greater than those of the first and the second waveguide layers 005, 007. In such case, in $(Al_{X4}Ga_{1-X4})_{Y2}In_{1-Y2}P$, $0.2 \leq X4 \leq 0.8$, so that the resultant first cladding layer 004 and the second cladding layer 008 may have an improved cladding performance to confine the current carriers within the active layer 006, and a desired transmittance to light emitted by the active layer 006. On the other hand, in $(Al_{X4}Ga_{1-X4})_{Y2}In_{1-Y2}P$, $0.3 \leq Y2 \leq 0.7$, so as to improve the crystal growth of the first and the second cladding layers 004, 008, thereby achieving optimal lattice match.

By controlling the compositions of the first and the second cladding layers 004, 008 (i.e., X4 and Y2 values), bowing of the infrared LED may be reduced.

The first cladding layer 004 and the second cladding layer 008 may have opposite polarities. The current carrier concentration and the thickness of each of the first and second cladding layers 004, 008 may be varied within a suitable range so as to enhance light-emitting efficiency. For instance, the first cladding layer 004 may be a p-type semiconductor layer doped with Mg, and the second cladding layer 008 may be an n-type semiconductor layer doped with Si. Each of the first cladding layer 004 and the second cladding layer 008 may have a current carrier concentration ranging from $7 \times 10^{17}$ cm$^{-3}$ to $3 \times 10^{18}$ cm$^{-3}$, and may have a thickness ranging from 0.1 μm to 1 μm.

The above arrangement of the first cladding layer 004, the first waveguide layer 005, the active layer 006, the second waveguide layer 007 and the second cladding layer 008 of the semiconductor light-emitting unit forms a double heterojunction structure to confine the current carriers within the active layer 006.

The semiconductor light-emitting unit may further include a current spreading layer 003 which is disposed on the first cladding layer 004 opposite to the first waveguide layer 005. The current spreading layer 003 may be made of a material which is transmissive to light emitted from the active layer 006. An example of a material for making the current spreading layer 003 may be gallium phosphide. In this embodiment, the current spreading layer 003 is doped with a p-type dopant (such as Mg). The current spreading layer 003 allows reduction of a strain between the active layer 006 and the epitaxial structure of the infrared LED.

The current spreading layer 003 may have a thickness ranging from 3 μm to 10 μm, so that current may be spread throughout the light-emitting unit. When the thickness of the current spreading layer 003 is lower than 3 μm, the current spreading layer 003 cannot efficiently spread the current. When the thickness of the current spreading layer 003 is greater than 10 μm, the manufacturing cost of the infrared LED would be increased.

The current spreading layer 003 may have a roughened surface which is opposite to the semiconductor light-emitting unit, and which has a surface roughness ranging from 100 nm to 300 nm. The roughened surface has irregular protruding parts which are formed by wet etching.

The infrared LED may further include a substrate 001 which is bonded to the current spreading layer 003 opposite to the semiconductor light-emitting unit, and which is light-transmissive to light emitted from the active layer 006. The substrate 001 has a surface opposite to the current spreading layer 003 serving as a light-exiting surface of the infrared LED. The substrate 001 may be made of a material which may have properties such as, e.g., high wet fastness, high chemical stability, high corrosion resistance, etc., and which may have a coefficient of thermal expansion similar to that of the semiconductor light-emitting unit. Examples of the material for making the substrate 001 may include, but are not limited to, aluminum-containing material, gallium phosphide, sapphire, and silicon carbide. In this embodiment, the substrate 001 is a sapphire substrate.

The substrate 001 may have a thickness equal to or greater than 50 μm, so as to provide a sufficient mechanical support to the semiconductor light-emitting unit. In addition, the substrate 001 may have a thickness not greater than 300 μm, so that it can be readily further mechanically processed after bonding to the semiconductor light-emitting unit.

The infrared LED may further include a bonding layer 002 which is light-transmissive and which is disposed between the roughened surface of the current spreading layer 003 and the substrate 001 to bond therewith. The roughened surface of the current spreading layer 003 may improve the bonding to the bonding layer 002. The bonding layer 002 may be made of silicon dioxide, and may have a thickness ranging from 1 μm to 5 μm. The bonding layer 002 may be formed by evaporation deposition.

The infrared LED may further include a first electrode 009 and a second electrode 010 that are disposed on a surface of the semiconductor light-emitting unit opposite to the substrate 001. Each of the first electrode 009 and the second electrode 010 is an ohmic electrode. The first electrode 009 may be disposed on the second cladding layer 008 opposite to the second waveguide layer 007, and is formed as an n-type ohmic electrode. The first electrode 009 may be made of an alloy including AuGe, or an alloy including Ni-alloy and Au. The second electrode 010 may be disposed on the current spreading layer 003 opposite to the bonding layer 002, and is formed as a p-type ohmic electrode. The second electrode 010 may be made of an alloy including AuBe and Au or an alloy including AuZn and Au. By forming the second electrode 010 on the p-type current spreading layer 003, an improved ohmic contact may be achieved so as to reduce a working voltage of the infrared LED.

The infrared LED may further include other commonly used functional layer(s) that is(are) disposed on the semiconductor light-emitting unit opposite to the substrate 001 (not shown in the figures). Examples of the functional layers may include, but are not limited to, a contacting layer for reducing contacting resistance of the ohmic electrode (e.g., the first electrode 009), a current spreading layer for horizontally spreading a driving current throughout the semiconductor light-emitting unit, and a current restricting layer for restricting flow of the driving current in a predetermined region.

A method for manufacturing the embodiment of the infrared LED according to the disclosure may include the following steps.

Figure 3:
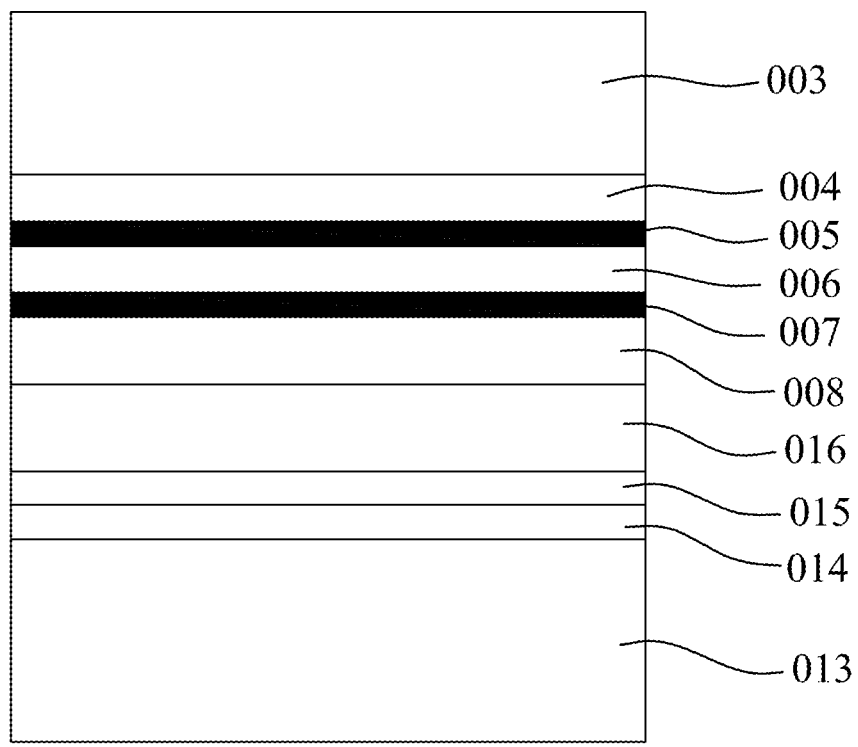
FIG. 3 is a sectional view illustrating an epitaxial structure for making the embodiment of the infrared LED according to the disclosure.

Referring to FIG. 3, a growth substrate 013 is first provided, and then, an epitaxial structure including semiconductors layers described below is formed on the growth substrate 013. Specifically, a buffer layer 014, an etch stop layer 015, and a contacting layer 016 are sequentially formed on the growth substrate 013 in such order, so as to assist the subsequent epitaxial growth of the semiconductor light-emitting unit thereon. In this embodiment, the semiconductor light-emitting unit includes the n-type second cladding layer 008, the second waveguide layer 007, the active layer 006, the first waveguide layer 005, the p-type first cladding layer 004, and the current spreading layer 003 (made of Mg-doped p-type GaP) that are sequentially formed on the contacting layer 016 in such order.

The growth substrate 013 may be a commercially available single crystal substrate made of GaAs. The growth substrate 013 has a growth surface which is smooth and suitable for growth of the epitaxial structure. To obtain a desired crystal quality of the semiconductor light-emitting unit, the growth surface includes a (100) plane or is inclined from the (100) plane by an angle of ±20°. In certain embodiments, the growth surface is inclined from the (100) plane in a direction of (0-1-1) by an angle of 15°±5°.

The growth substrate 013 may have a low dislocation density, such as not greater than 10000 cm−2, or not greater than 1000 cm−2, so as to improve the growth of the epitaxial structure. The growth substrate 013 may be an n-type semiconductor doped with, e.g., Si, and may have a current carrier concentration ranging from $1 \times 10^{17}$ cm$^{-3}$ to $5 \times 10^{18}$ cm$^{-3}$.

The growth substrate 013 may have a predetermined thickness depending on a size of a surface thereof for growth of the epitaxial structure. If the growth substrate 013 is too thin, the epitaxial structure may break during the manufacturing process thereof. In addition, increasing the thickness of the growth substrate 013 may reduce bowing of the active layer 006 of the semiconductor light-emitting unit, so that a temperature distribution during growth of the epitaxial structure becomes more even, thereby improving a wavelength distribution of light emitted from the active layer 006. However, the thickness of the growth substrate 013 may not be too thick, otherwise a manufacturing cost of the infrared LED may be undesiredly increased. In certain embodiments, when the surface of the growth substrate 013 has a diameter of 100 mm, the growth substrate may have a thickness ranging from 350 μm to 600 μm. When the surface of the growth substrate 013 has a diameter of 75 mm, the growth substrate 013 may have a thickness ranging from 250 μm to 500 μm. When the surface of the growth substrate 013 has a diameter of 50 mm, the growth substrate 013 may have a thickness ranging from 200 μm to 400 μm.

The buffer layer 014 is configured to relieve a lattice defect between the growth substrate 013 and the semiconductor light-emitting unit. The buffer layer 014 may be made of a material identical to that of the growth substrate 013 (i.e., GaAs in this embodiment). Alternatively, the buffer layer 014 may be made of other materials different from that of the growth substrate 013, and may be formed as a multi-layered structure to effectively relieve the lattice defect. The buffer layer 014 may have a thickness not smaller than 0.1 μm, such as not smaller than 0.2 μm.

The etch stop layer 015 is conducive to a selective etching process to be conducted during the following steps in manufacturing of the infrared LED. The contacting layer 016 may reduce a contact resistance between the light-emitting unit and the first electrode 009 to be subsequently formed thereon. The contacting layer 016 may be made of a material which has a band gap larger than that of the active layer 006, for instance, a semiconductor compound represented by $(Al_{X5}Ga_{1-X5})_{Y3}In_{1-Y3}P$, wherein $0 \leq X5 \leq 1$. The contacting layer 016 may have a current carrier concentration that is not lower than $5 \times 10^{17}$ cm$^{-3}$ (such as not lower than $1 \times 10^{18}$ cm$^{-3}$), so as to effectively reduce the contact resistance to the electrode 009. The contacting layer 016 may have a current carrier concentration that is not greater than $2 \times 10^{19}$ cm$^{-3}$, so as to prevent the reduction of a crystallinity of the contacting layer 016. The contacting layer 016 may have a thickness that is not lower than 0.5 µm, such as not lower than 1 µm. However, to save the manufacturing cost of the infrared LED, the thickness of the contacting layer 016 is controlled to be not greater than 5 µm.

Figure 4:
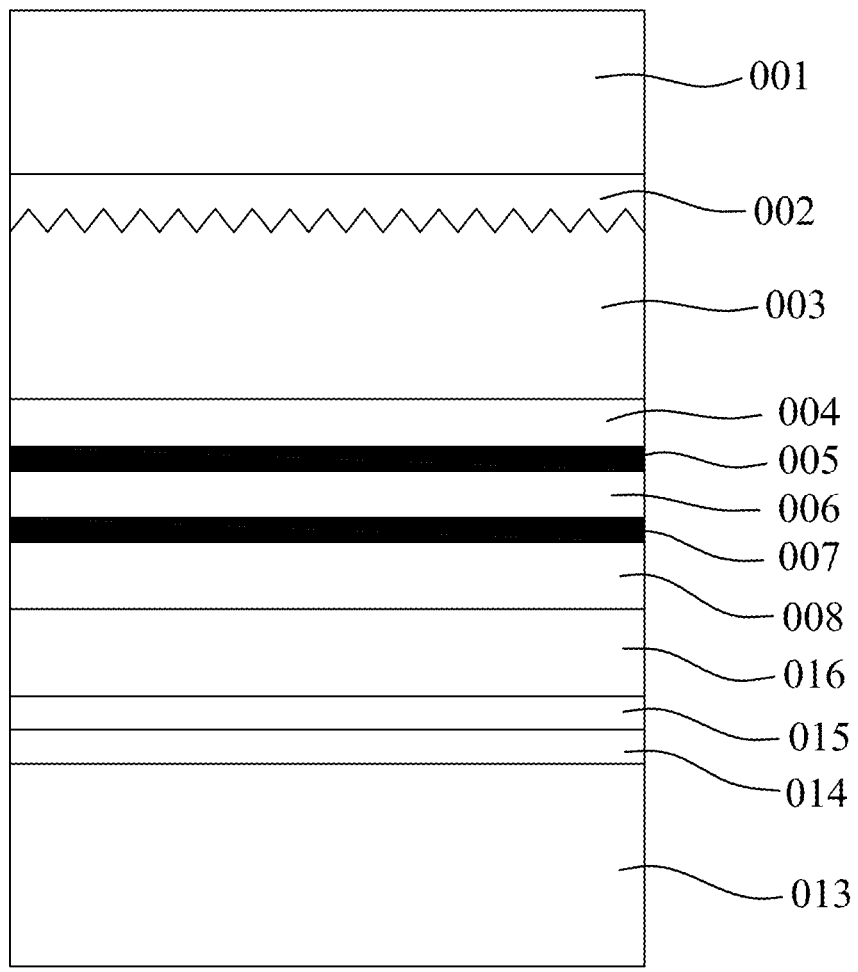
FIG. 4 is a sectional view illustrating the epitaxial structure of FIG. 3 being bonded to a substrate.

Referring to FIG. 4, a surface of the current spreading layer 003 opposite to the first cladding layer 004 is roughened by a wet-etching process. Then, the bonding layer 002 (made of SiO2 and having a thickness of 2 µm in this embodiment) is formed on the resultant roughened surface of the current spreading layer 003 by evaporation deposition.

A surface of the bonding layer 002 opposite to the current spreading layer 003 may be polished to form a smooth surface, and then the substrate 001 made of sapphire is bonded to the smooth surface of the bonding layer 002.

Afterwards, the growth substrate 013, the buffer layer 014 and the etching resist layer 015 are removed by, e.g., a mechanical thinning process and/or a chemical etching process, so as to expose the contacting layer 016.

A portion of the contacting layer 016 is masked and an etching process is performed to selectively remove unmasked portion of the contacting layer 016, as well as predetermined portions of the second cladding layer 008, the second waveguide layer 007, the active layer 006, the first waveguide layer 005, and the first cladding layer 004, so as to expose a portion of the current spreading layer 003.

The first electrode 009 is formed on the second cladding layer 008, e.g., on the exposed portion of the contacting layer 016. The second electrode 010 is formed on the exposed portion of the current spreading layer 003.

Finally, the substrate 001 is subjected to a thinning process, and the resultant product is cut by e.g., laser so as to obtain the infrared LED as shown in FIG. 1.

Figure 5:
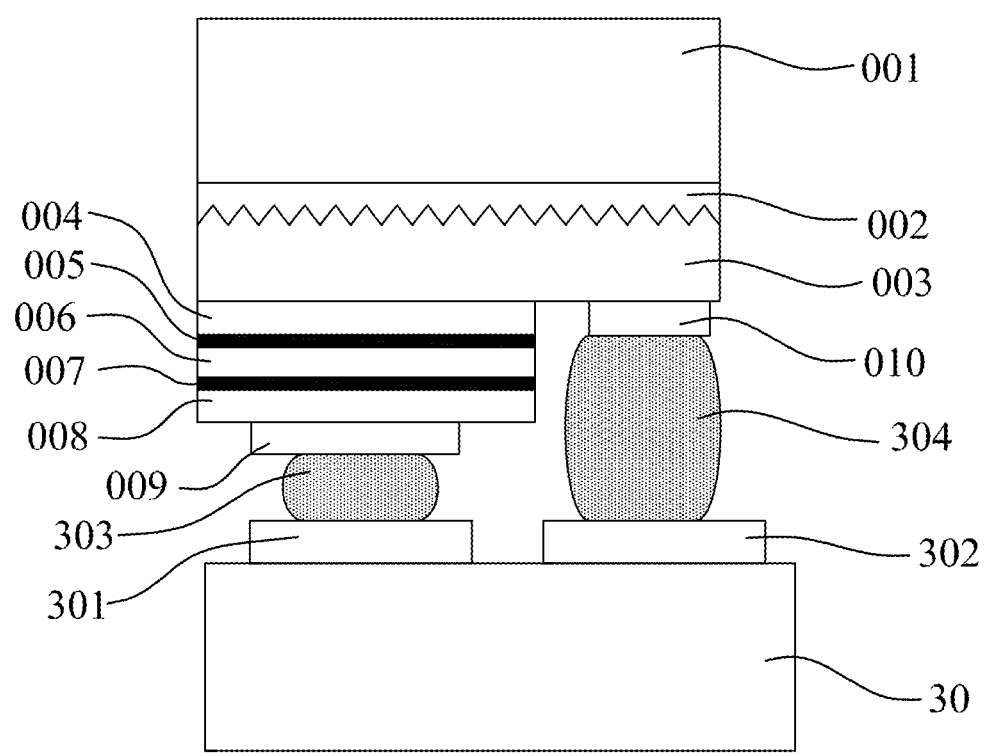
FIG. 5 is a schematic view illustrating an embodiment of an infrared LED packaged module according to the disclosure.

Referring to FIG. 5, an embodiment of an LED packaged module includes a mounting board 30, and at least one aforementioned infrared LED of this disclosure which is mounted on the mounting board 30.

The mounting board 30 may be an insulating board. The mounting board 30 includes a first electrode terminal 301 and a second electrode terminal 302. The first and the second electrode terminals 301, 302 are electrically isolated from each other, and are disposed on a surface of the mounting board 30. The infrared LED is mounted onto the surface of the mounting board 30. The first and the second electrodes 009, 010 of the infrared LED are respectively connected to the first and the second electrode terminals 301, 302 through a first connecting element 303 and a second connecting element 304. Each of the first connecting element 303 and the second connecting element 304 may include, but is not limited to, a soldering material, e.g., an eutectic solder and a reflowed solder.

The LED infrared LED of this disclosure may be applied in various aspects, such as lighting devices, remote control devices, etc.

The disclosure will be further described by way of the following examples. However, it should be understood that the following examples are solely intended for the purpose of illustration and should not be construed as limiting the disclosure in practice.

EXAMPLES

Example 1 (E1)

An infrared LED of E1 is configured to emit a light having a wavelength of 830 nm, and is made by procedures similar to those of the embodiment of the infrared LED as described above.

To be specific, a growth substrate made of single crystal GaAs and doped with Si is provided. The growth substrate 013 has a growth surface for the subsequent growth of an epitaxial structure, and the growth surface is tilted in a direction of (0-1-1) from the (100) plane by an angle of 15°. The growth substrate has a current carrier concentration of $2\times10^{18}$ cm$^{-3}$, and a diameter of 100 mm and a thickness of 350 µm.

The epitaxial structure includes the following semiconductor layers which are sequentially formed on the growth substrate 013 using a metal organic chemical vapor deposition (MOCVD) device:

(1) a buffer layer made of undoped GaAs, and having a thickness of approximately 0.3 µm.

(2) an etch stop layer made of $Ga_{0.5}In_{0.5}P$.

(3) a contacting layer made of $(Al_{0.6}Ga_{0.4})_{0.5}In_{0.5}$ P and doped with Si. In addition, the contacting layer has a thickness of approximately 3 µm and a current carrier concentration of $1\times10^{18}$ cm$^{-3}$.

(4) an n-type second cladding layer made of $Al_{0.5}In_{0.5}P$ and doped with Si. In addition, the n-type second cladding layer has a thickness of approximately 0.5 µm and a current carrier concentration of $1\times10^{18}$ cm$^{-3}$.

(5) a second waveguide layer made of $(Al_{0.7}Ga_{0.3})_{0.5}In_{0.5}P$, and having a thickness of approximately 80 nm.

(6) an active layer having a multiple quantum well structure which includes 5 pairs of layers, each of which includes a well layer made of $In_{0.2}Ga_{0.8}As$ and having a thickness of approximately 5.5 nm; and a barrier layer made of $Al_{0.2}Ga_{0.8}P$, and having a thickness of approximately 15 nm. The well layers and the barrier layers are alternately stacked on one another in the multiple quantum well structure. In addition, a bonding region between the active layer and the second waveguide layer has an area of 60000 µm2 (with a dimension of 300 µm×200 µm).

(7) a first waveguide layer made of $(Al_{0.7}Ga_{0.3})_{0.5}In_{0.5}P$, and having a thickness of approximately 0.2 µm. A bonding region between the active layer and the first waveguide layer has an area of 60000 µm2 (with a dimension of 300 µm×200 µm).

(8) a p-type first cladding layer made of $Al_{0.5}In_{0.5}P$ and doped with Mg. In addition, the p-type first cladding layer has a thickness of approximately 0.4 µm and a current carrier concentration of $1.5\times10^{18}$ cm$^{-3}$.

(9) an intermediate layer (formed as a thin film) made of $(Al_{0.4}Ga_{0.6})_{0.5}In_{0.5}P$, and having a current carrier concentration of $1\times10^{18}$ cm$^{-3}$ and

(10) a p-type current spreading layer made of GaP and doped with Mg. In addition, the p-type current spreading layer has a thickness of approximately 8 µm and a current carrier concentration of $4\times10^{18}$ cm$^{-3}$.

During the epitaxial growth of these semiconductor layers, Group III elements are sourced from trimethylaluminum ((CH3)3Al), trimethylgallium ((CH$_3$)$_3$Al), and trimethylindium ((CH$_3$)$_3$In), and Group V elements are sourced from PH$_3$ and AsH$_3$. In addition, the Mg dopant is sourced from Bis(methylcyclopentadienyl)magnesium (bis-(C$_5$H$_5$)$_2$Mg), and the Si dopant is sourced from disilane (Si$_2$H$_6$). Each of the semiconducter layers is grown at a temperature ranging from 680° C. to 750° C., except that the current spreading layer 003 is grown at a temperature not lower than 750° C.

Then, a surface of the current spreading layer opposite to the intermediate layer is roughed by wet etching. A bonding layer having a thickness of 2.0 µm and made of SiO$_2$ is formed on the roughened surface of the current spreading layer. A surface of the bonding layer opposite to the current spreading layer is polished, and then a transparent substrate made of a sapphire is bonded to the polished surface of the bonding layer.

Afterwards, the growth substrate, the buffer layer and the etch stop layer are removed by thinning and etching processes to expose the contacting layer. A portion of the contacting layer is masked and an etching process is performed to selectively remove unmasked portion of the second cladding layer, and corresponding portions of the second waveguide layer, the active layer, the first waveguide layer, the first cladding layer and the intermediate layer, so as to expose a portion of the current spreading layer.

A first electrode and a second electrode are respectively formed on the contacting layer and the exposed portion of the current spreading layer.

Finally, the substrate is thinned, followed by laser cutting to obtain the infrared LED of E1. It is found that after the growth substrate is removed, the semiconductors layers still maintain good adherence to the bonding layer, and are securely bonded to the substrate 001 through the bonding layer 002.

Comparative Example 1 (CE1)

The infrared LED of CE1 is prepared by procedures generally similar to those of Example 1, except that each of the first waveguide layer and the second waveguide layer is made of AlGaAs.

By applying a forward current of 5 mA, each of the infrared LEDs of E1 and CE1 is subjected to determination of optoelectronic properties. The results are shown in Table 1.

TABLE 1

| | Material | | | |
| | First and second cladding layers | First and second waveguide layers | Power output, $P_o$ (mw) | Forward voltage, $V_f$ (V) |
|---|---|---|---|---|
| E1 | AlGaInP | AlInP | 2 | 1.95 |
| CE1 | AlGaInP | AlGaAs | 1 | 3.00 |

As shown in Table 1, when compared with CE1, the infrared LED of E1 shows a higher power output and a lower forward voltage, indicating that the infrared LED of E1 exhibits a smaller resistance between the current spreading layer and the substrate, and has an improved ohmic contact of the first and second electrodes. This is because in the infrared LED of E1, interfaces between the first and second waveguide layers made of AlInP and the first and second cladding layers have less defects when compared with those of CE1 which includes the first and second waveguide layers made of AlGaAs. Thus, the infrared LED of the disclosure is conferred with an improved power output and light output efficiency.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiment(s), it is understood that this disclosure is not limited to the disclosed embodiments but is intended to cover various arrangements included within the spirit and scope of the broadest interpretation so as to encompass all such modifications and equivalent arrangements.

What is claimed is:

1. An infrared light-emitting diode (LED), comprising
a semiconductor light-emitting unit which includes:
an active layer having a quantum well structure which includes at least one pair of layers, each pair of layers including a well layer and a barrier layer;
a first waveguide layer and a second waveguide layer respectively disposed on two opposite sides of said active layer, and independently made of a semiconductor compound represented by $(Al_{X3}Ga_{1-X3})_{Y1}In_{1-Y1}P$, wherein $0 \leq X3 \leq 1$ and $0 < Y1 \leq 1$;
a first cladding layer disposed on said first waveguide layer opposite to said active layer;
a second cladding layer disposed on said second waveguide layer opposite to said active layer; and
a current spreading layer disposed on said first cladding layer opposite to said first waveguide layer, and having a roughened surface opposite to said semiconductor light-emitting unit,
a substrate which is light-transmissive and which is bonded to said current spreading layer opposite to said semiconductor light-emitting unit, and
a bonding layer which is light-transmissive and which is disposed between said roughened surface of said current spreading layer and said substrate to bond therewith,
wherein said barrier layer is made of a semiconductor compound represented by $(Al_{X2}Ga_{1-X2})As$, wherein $0 \leq X2 \leq 1$.

2. The infrared LED of claim 1, wherein said current spreading layer is made of gallium phosphide.

3. The infrared LED of claim 1, wherein said roughened surface has a surface roughness which ranges from 100 nm to 300 nm.

4. The infrared LED of claim 1, wherein said well layer is made of a semiconductor compound represented by $(In_{X1}Ga_{1-X1})As$, wherein $0 \leq X1 \leq 1$.

5. The infrared LED of claim 4, wherein $0.1 \leq X1 \leq 0.3$.

6. The infrared LED of claim 1, wherein said first cladding layer and said second cladding layer are independently made of a semiconductor compound represented by $(Al_{X4}Ga_{1-X4})_{Y2}In_{1-Y2}P$, wherein $0 \leq X4 \leq 1$ and $0 < Y2 \leq 1$.

7. The infrared LED of claim 6, wherein $0.2 \leq X4 \leq 0.8$ and $0.3 \leq Y2 \leq 0.7$.

8. The infrared LED of claim 1, wherein said well layer has a thickness ranging from 3 nm to 30 nm.

9. The infrared LED of claim 1, wherein said quantum well structure of said active layer includes not greater than 10 pairs of layers, and said well layers and said barrier layers in said quantum well structure are alternately stacked.

10. The infrared LED of claim 1, wherein said semiconductor light-emitting unit is configured to emit a light having a wavelength that ranges from 680 nm to 1100 nm.

11. The infrared LED of claim 1, wherein $0.2 \leq X3 \leq 0.8$, and $0.3 \leq Y1 \leq 0.7$.

12. The infrared LED of claim 1, wherein said current spreading layer has a thickness ranging from 3 μm to 10 μm.

13. The infrared LED of claim 1, wherein said substrate has a surface opposite to said current spreading layer serving as a light-exiting surface of said infrared LED.

14. The infrared LED of claim 13, further comprising a first electrode and a second electrode that are disposed on a surface of said semiconductor light-emitting unit opposite to said substrate.

15. The infrared LED of claim 14, wherein each of said first electrode and said second electrode is an ohmic electrode.

16. The infrared LED of claim 1, wherein said substrate is made of a material selected from the group consisting of gallium phosphide, sapphire and silicon carbide.

17. An LED packaged module, comprising a mounting board, and at least one infrared LED as claimed in claim 1 which is mounted on said mounting board.

18. The infrared LED of claim 2, wherein said bonding layer is made of silicon dioxide.

19. An infrared light-emitting diode (LED), comprising a semiconductor light-emitting unit which includes:

an active layer having a quantum well structure which includes at least one pair of layers, each pair of layers including a well layer and a barrier layer;

a first waveguide layer and a second waveguide layer respectively disposed on two opposite sides of said active layer, and independently made of a semiconductor compound represented by $(Al_{X3}Ga_{1-X3})_{Y1}In_{1-Y1}P$, wherein $0 \leq X3 \leq 1$ and $0 < Y1 \leq 1$;

a first cladding layer disposed on said first waveguide layer opposite to said active layer;

a second cladding layer disposed on said second waveguide layer opposite to said active layer; and a current spreading layer disposed on said first cladding layer opposite to said first waveguide layer, and having a roughened surface opposite to said semiconductor light-emitting unit, a substrate which is light-transmissive and which is bonded to said current spreading layer opposite to said semiconductor light-emitting unit, and a bonding layer which is light-transmissive and which is disposed between said roughened surface of said current spreading layer and said substrate to bond therewith, wherein said current spreading layer is made of gallium phosphide, and wherein said bonding layer is made of silicon dioxide.

20. The infrared LED of claim 19, wherein said bonding layer has a thickness ranging from 1 μm to 5 μm.

* * * * *